(12) United States Patent
Fisk et al.

(10) Patent No.: US 6,326,808 B1
(45) Date of Patent: Dec. 4, 2001

(54) INVERSION OF PRODUCT TERM LINE BEFORE OR LOGIC IN A PROGRAMMABLE LOGIC DEVICE (PLD)

(75) Inventors: Mathew Fisk, San Jose; Apurva Patel, Fremont; Bradley Sharpe-Geisler, San Jose, all of CA (US)

(73) Assignee: Vantis Corporation, San Jose, CA (US)

( * ) Notice: Subject to any disclaimer, the term of this patent is extended or adjusted under 35 U.S.C. 154(b) by 0 days.

(21) Appl. No.: 09/454,322

(22) Filed: Dec. 3, 1999

Related U.S. Application Data

(60) Provisional application No. 60/116,895, filed on Jan. 22, 1999, provisional application No. 60/111,976, filed on Dec. 11, 1998, and provisional application No. 60/110,831, filed on Dec. 3, 1998.

(51) Int. Cl.[7] .................................................... H01L 25/00
(52) U.S. Cl. ................................................. 326/41; 326/39
(58) Field of Search ................................... 326/38, 39, 41

(56) References Cited

U.S. PATENT DOCUMENTS

| | | | |
|---|---|---|---|
| 5,789,939 | * | 8/1998 | Agrawal et al. ........................ 326/41 |
| 6,020,759 | * | 2/2000 | Heile ...................................... 326/40 |
| 6,107,822 | * | 8/2000 | Mendel et al. ......................... 326/39 |

* cited by examiner

*Primary Examiner*—Michael Tokar
*Assistant Examiner*—Anh Q. Tran
(74) *Attorney, Agent, or Firm*—Fliesler, Dubb, Meyer & Lovejoy, LLP

(57) ABSTRACT

A PLD circuit configuration is provided to use less product term lines than a typical PLD to perform an OR operation without using an OR gate. In one embodiment, an inverter is provided between the output of one product term line and the input of an OR gate. The inverter enables the one product term provided to it to provide an OR operation. This is because when two or more elements are ANDed in a product term, inverting the product term creates an OR operation with the elements inverted. With an OR operation provided using a single product term and inverter, less product term lines are needed when performing some operations. In another embodiment, an OR gate output is provided to the first input of a look up table (LUT), while a single product term line is provided to a second input of the LUT. The LUT can be programmably configured to perform a number of Boolean logic functions, such as an OR gate, an XOR gate, etc. The input to the LUT can further be programmed to be inverted, enabling a single product term input to the LUT to be used where two separate product terms might otherwise be required.

16 Claims, 9 Drawing Sheets

INVERSION OF PRODUCT TERM LINE BEFORE OR LOGIC IN A PROGRAMMABLE LOGIC DEVICE (PLD)

CROSS-REFERENCE TO PROVISIONAL APPLICATION

This Patent Application claims the benefit of Provisional Application No. 60/110,831 filed Dec. 3, 1998, Provisional Application No. 60/111,976 filed Dec. 11, 1998, and Provisional Application No. 60/116,895 filed Jan. 22, 1999.

BACKGROUND OF THE INVENTION

1. Field of the Invention

The present invention relates to a configuration of circuitry for a programmable logic device (PLD) to limit the number of product term lines need to perform a Boolean operation.

2. Background

FIG. 1 shows an array structure for a typical prior art programmable array logic (PAL) device, a type of PLD. The PAL of FIG. 1 has six inputs $I_{0-5}$ and four outputs $O_{0-3}$. The PAL device further has an AND array 100 followed by an OR array 102. An input such as $I_0$ to the PAL has a true output 104 and a complement output 106 forming rows connected to programmable interconnect cells 108 containing individual cells, such as 110. A cell like cell 110 may be programmed to be connected or disconnected to an AND gate in the AND array 100. Nonprogrammable interconnect points 120 connect the output of the AND gates 100 to the OR gates of the OR array 102. Although points 120 are described as nonprogrammable, programmable cells may likewise be used. Additional programmable features may also be added, such an output macro cell 114 which is programmable to allow an output to be either registered or combinatorial.

A group of cells as shown at 112 may be connected to an AND gate with the output of the AND gate providing a product term. Although shown as an AND array 100, in reality the AND array 100 has AND gates implemented using NOR gates with true and complement row connections to cells 108 reversed internally. An example of the PLD with circuitry similar to that shown and described with respect to FIG. 1 is included in the MACH 4 PLDs manufactured by Lattice/Vantis Semiconductor Corporation of Sunnyvale, California.

FIG. 2 illustrates programming of a PAL device as shown in FIG. 1 to perform the Boolean operation /a*b+a*/b+/b+a, where "/" indicates a Boolean NOT, "*" indicates a Boolean AND, and "+" indicates a Boolean OR operation. The PAL device of FIG. 2 receives two inputs "a" and "b". Inverting/Noninverting buffers 200 provides a and its inverse /a, while inverting/noninverting buffer 202 provides b and its inverse /b to be selectively connected to form four product terms 210–213. For the first product term 210, /a and b are connected to form the Boolean equation /a*b. For the second product term 211, a and /b are connected to form the Boolean equation a*/b. For product term 212 only /b is connected, while for product term 213 only a is connected. Note that connected programmable interconnect cells are represented by a darkened circle symbol, while interconnect cells programmed to be unconnected are shown as a circle without darkening. The product terms 210–213 are provided to inputs of an OR gate 220, so the output of OR gate 220 provides the desired Boolean operation /a*b+a*/b+/b+a.

SUMMARY OF THE INVENTION

In accordance with the present invention, a PLA circuit configuration is provided which uses less product term lines than a typical PLA to perform a similar operation. Such circuitry in accordance with the present invention enables the Boolean operation /a*b+a*/b+/b+a illustrated in FIG. 2 to be performed with only three product terms, as opposed to the four product term lines used in the circuit of FIG. 2.

In one embodiment of the present invention, an inverter is provided between the output of one product term line and the input of an OR gate. The inverter enables the one product term to provide an OR operation. This is because when two or more elements are ANDed in a product term, inverting the product term creates an OR operation with the elements inverted. With an OR operation provided using a single product term and inverter, less product term lines are needed when performing some operations.

For example, the elements /b and a are provided on separate product terms 212 and 213 to OR gate 220 to provide the operation /b+a in FIG. 2. In accordance with the present invention, the terms b and /a can be ANDed using a single product term, and when the single product term line is inverted it will provide the operation /b+a without requiring use of a separate product term line and OR gate.

In accordance with another embodiment of the present invention, the output of the OR gate of the PAL device is provided to a first input of an exclusive OR (XOR) gate. A second input of the XOR gate as well as one input of the OR gate is driven by a product term line as provided through a buffer. The product term line voltage range is typically ±0.6 volts to enable rapid switching, but the input of the XOR gate is driven by a CMOS signal ranging from 0.0 to 5.0 volts. Buffering is, thus, provided between the product term line and XOR gate enabling translation between the different voltage ranges. An inverter can be provided between the buffer and XOR gate since the inverter is typically a CMOS device with a 0.0 to 5.0 volt input and output range.

In another embodiment in accordance with the present invention, the output of the OR gate of the PAL device is provided to the first input of a look up table (LUT), while a single product term line is provided to a second input of the LUT. The LUT can be programmably configured to perform a number of Boolean logic functions, such as an OR gate, an XOR gate, etc. An input to the LUT can further be programmed to be inverted, enabling a single product term input to the LUT to be used where two separate product terms might otherwise be required as described previously.

BRIEF DESCRIPTION OF THE DRAWINGS

The present invention will be described with respect to particular embodiments thereof, and references will be made to the drawings in which.

DETAILED DESCRIPTION

Figure 2:
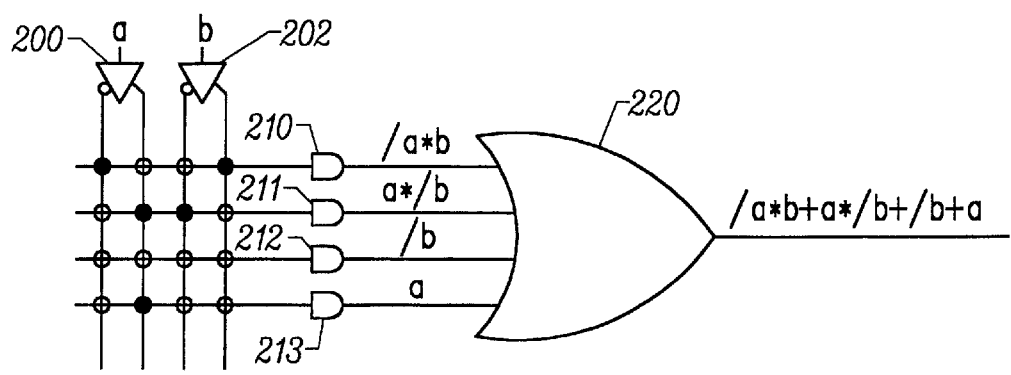
FIG. 2 illustrates programming of the PAL of FIG. 1 to perform the Boolean operation.
Figure 3:
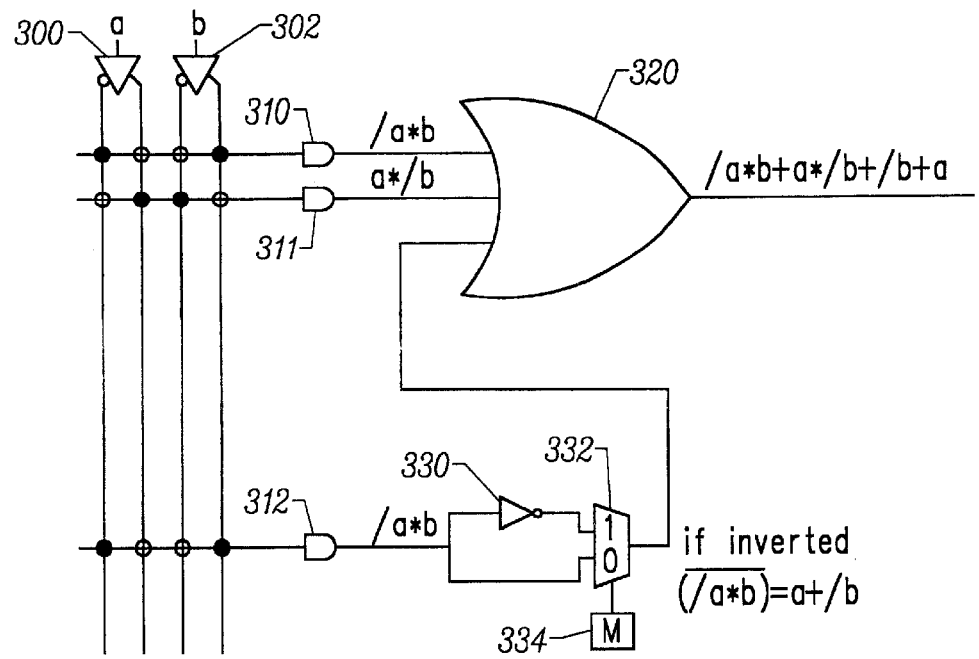
FIG. 3 shows modifications to the PAL circuitry of FIG. 1 in accordance with the present invention to perform the same Boolean operation as performed by the circuitry of FIG. 2, but using less product term lines.

FIG. 3 shows modifications to the PAL device of FIG. 2 in accordance with the present invention to perform the same Boolean operation /a*b+a*/b+/b+a as performed by the circuit of FIG. 2. As in FIG. 2, the circuit of FIG. 3 includes inverting/noninverting buffers 300 and 302 for providing a, /a, b and /b to be selectively connected to form product terms 310–312. For product term 310, /a and b are connected, similar to product term 210 of FIG. 2, to provide the Boolean operation /a*b. Similarly, product term 311 has a and /b connected to provide the Boolean operation a*/b, as with the product term 211 of FIG. 2.

The modification of FIG. 3 includes addition of the inverter 330, multiplexer 332, and memory cell 334. The inverter 330 is added between the AND gate 312 and OR gate 320 to enable only one product term to be used to provide the operation a+/b. In FIG. 2, two product terms 212 and 213 were needed. Only one product term is needed when the inverter 330 is used because if the complement of a desired ORed output is ANDed, and then the entire ANDed operation is inverted, the desired ORed output is obtained. For instance, as shown in FIG. 3 to get the desired value a+/b, the elements /a and b are ANDed to form the Boolean equation /a*b. Then by taking its inverse /(/a*b) the result a+/b is obtained.

Note that only one product term, such as 312, needs to be inverted to enable ORing a multiple number of terms which previously required separate product terms, such as 212 and 213 of FIG. 3. For example to provide the Boolean operation a+/a+b previously required three separate product terms. However, by connecting /a, a, and /b to a single product term the result /a*a*/b is derived. By providing this result through an inverter such as 330, the desired result /(/a*a*/b)=a+/a+b is obtained.

The multiplexer 332 and memory cell 334 add flexibility to a PLD. The goal for a PLD is to maximize reconfigurability and limit wasted resources. By programming the memory cell 334 so that multiplexer 332 provides the product term 312 through inverter 330 when product terms can be combined as described above, other product terms are freed up to be used for larger operations. If the inverter 330 is not desired, the memory cell 334 can be programmed so that multiplexer 332 provides the signal from product term 312 directly to the OR gate 320.

Figure 4:
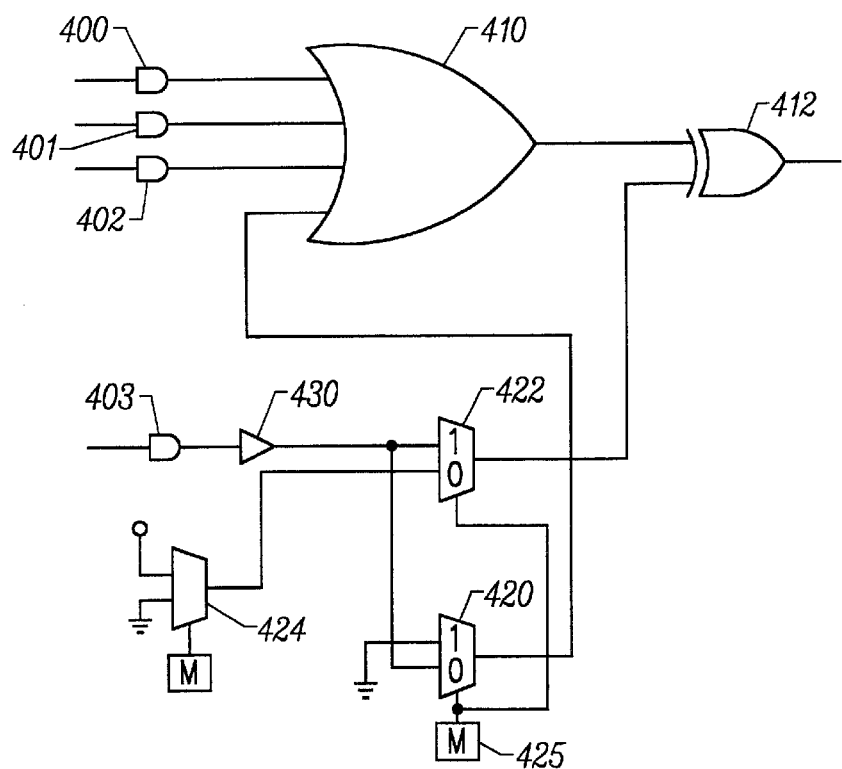
FIG. 4 shows circuitry in accordance with the present invention to allow faster switching times when an exclusive or (XOR) gate is used with a PAL device.

FIG. 4 shows circuitry in accordance with the present invention to allow faster switching times when an exclusive or (XOR) gate is used with a PAL device. In addition to the product term lines 400–403 and OR gate 410, similar to FIG. 3, the circuit of FIG. 4 further includes an XOR gate 412 which has one input receiving the output of the OR gate 410. The product term 403 is selectively provided using multiplexer 420 as a product term to OR gate 410. Multiplexer 420 either provides the product term 403 or a logic 0 to OR gate 410 depending on the state of memory cell 425. The product term 403 is also selectively provided by multiplexer 422 to the XOR gate 412 for polarity control. Multiplexer 422 either provides the product term 403 or a logic output of multiplexer 424 to the XOR gate to provide a variable or fixed polarity.

Inputs to the AND gates 400–403 forming product terms typically have a voltage swing of ±0.1 volt to maximize operation speed and minimize power consumption. The outputs of the AND gates also only have a voltage swing of ±0.6 volts. However, the output of OR gate 410 has a rail to rail voltage swing of 0.0 to 5.0 volts. To enable the output of the AND gate 403 to drive the XOR gate, a buffer 430 is typically included.

Figure 5:
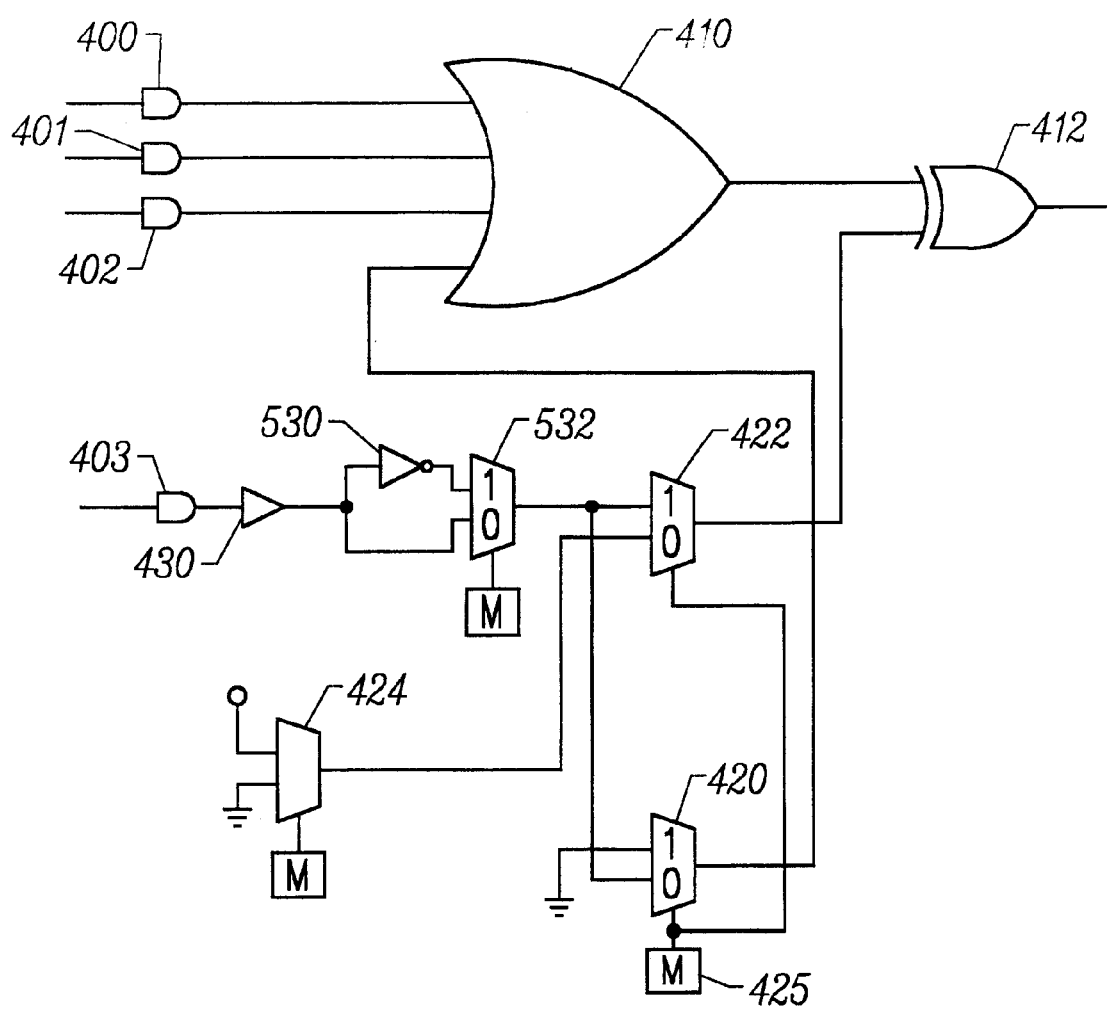
FIG. 5 shows modifications to the circuitry of FIG. 4 to allow a Boolean operation to be performed with limited product term lines similar to FIG. 3.

FIG. 5 shows modifications to the circuitry of FIG. 4 to allow a Boolean operation to be performed with limited product term lines, similar to the circuit of FIG. 3. As shown, FIG. 5 modifies FIG. 4 by adding an inverter 530 and multiplexer 532 between the buffer 430 and multiplexers 422 and 420. Because the buffer 430 has already raised the power level to a 0 to 5 volt rail to rail voltage, the additional inverter 530 will not significantly affect typical power consumption. The additional multiplexer 532 and inverter 530 further do not add significant circuitry to the configuration of FIG. 4.

Figure 1:
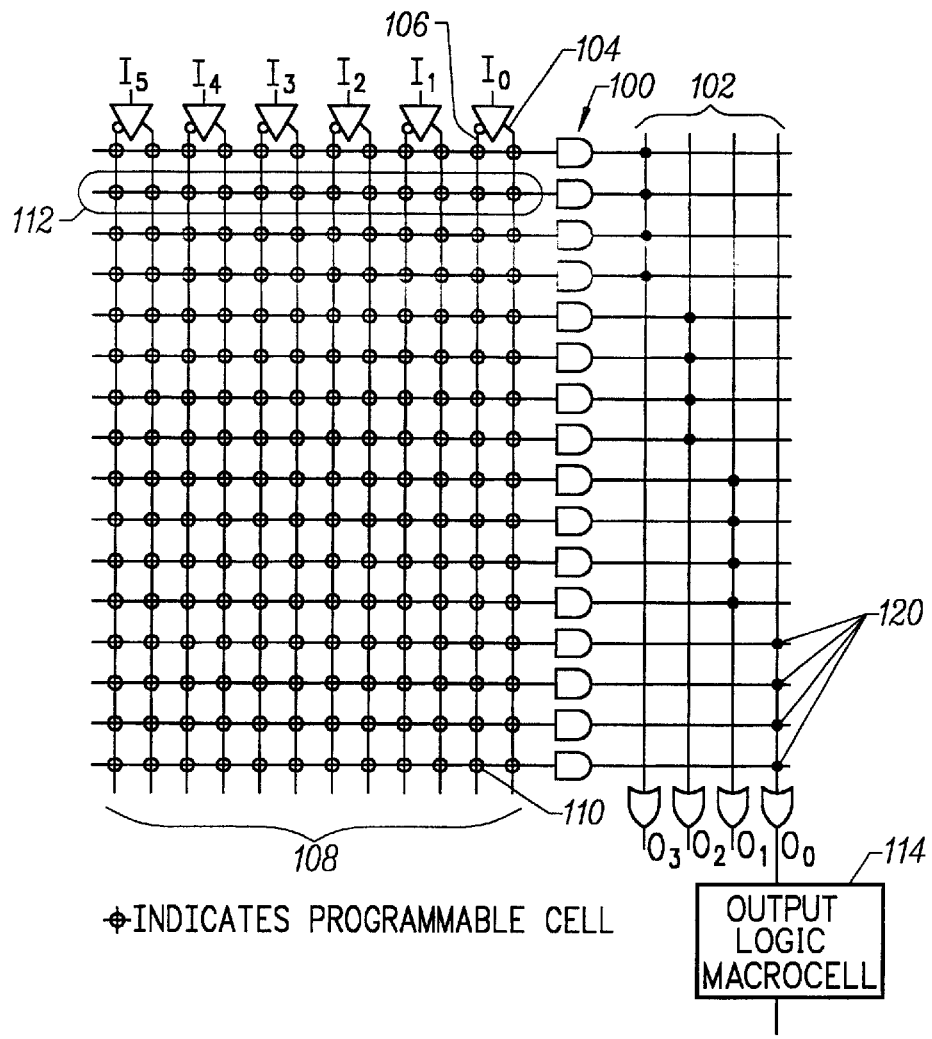
FIG. 1 shows the structure for a conventional PAL device.
Figure 6:
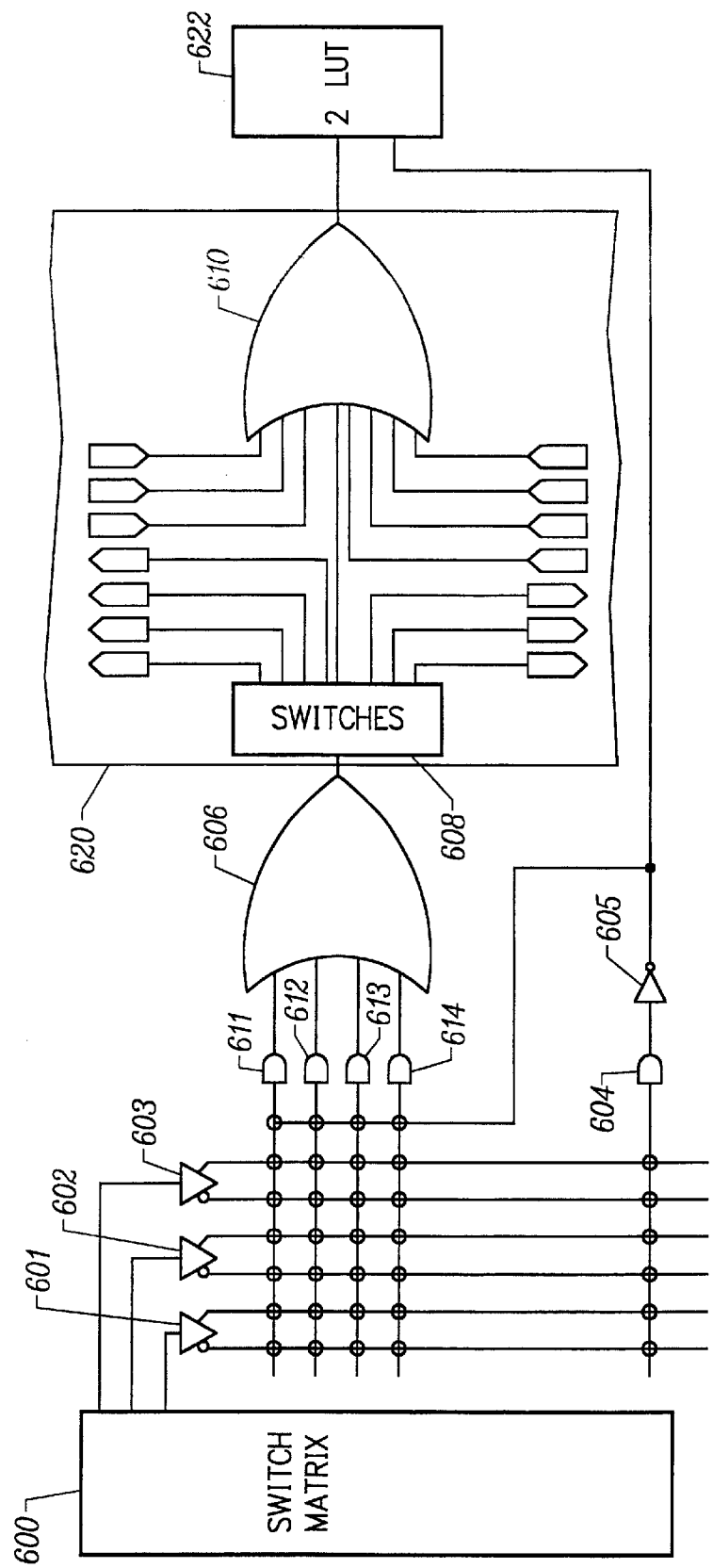
FIG. 6 shows an embodiment in accordance with the present invention used with a complex PLD(CPLD)

FIG. 6 shows an embodiment in accordance with the present invention used with complex PLD (CPLD) circuitry. The CPLD essentially combines a number of smaller PLDs having components as shown in FIG. 1. To combine a smaller number of PLDs, the circuit of FIG. 6 uses a switch matrix 600 which distributes signals to inputs of the smaller PLD units. As shown, signals from the switch matrix 600 are provided to noninverting/inverting input buffers 601–603. The switch matrix similarly distributes signals to inputs of other smaller PLD units.

FIG. 6 further includes a dedicated inverter 605 connecting the output of AND gate 604 to the inputs of AND gates 611–614. FIG. 6, thus, illustrates that the inverter 605 can be dedicated rather than selectively connected between an AND gate and OR gate as shown in FIGS. 3–5. FIG. 6 further illustrates that the output of inverter 605 can be provided to the OR gate 606 using programmable connections to AND gates forming product terms 611–614.

Further in FIG. 6, the output of the OR gate 606 is provided to a circuit 620 which includes switches 608 for distributing the signal from OR gate 606 to one or more additional OR gates such as OR gate 610. Additional switches similar to 608 in the circuit 620 (not shown) also distribute signals to OR gate 610. The output of the OR gate 606 can also be routed by switches 608 for other uses, such as for asynchronous clocking, asynchronous preset/set, and for individual output enable controls. Circuitry similar to that in circuit 612 for a CPLD can be found in the MACH 4 circuits manufactured by Lattice/Vantis Semiconductor Corporation.

FIG. 6 further illustrates connection of the output of OR gate 610 to a two input look up table 622. A second input to the look up table 622 can also be provided directly from the output of inverter 605 as shown. The look up table 622 can be programmed to function as one of multiple types of devices, such as an AND, NAND, OR, NOR, XOR, or XNOR gate, or a combination of these devices.

Figure 7:
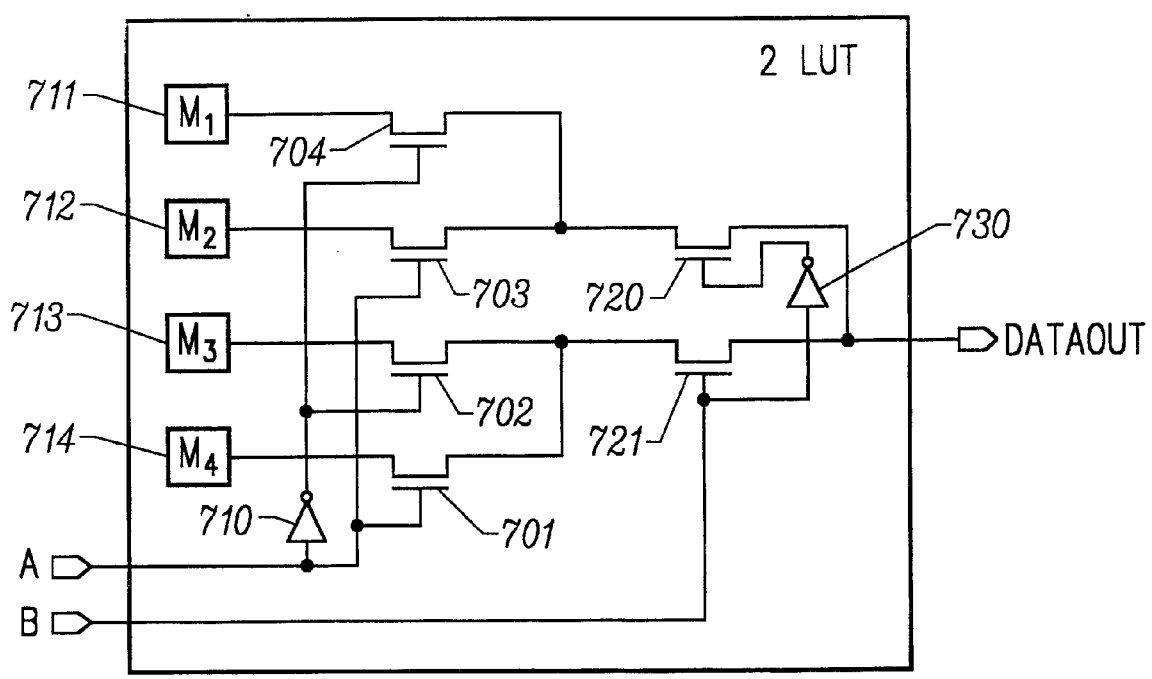
FIG. 7 shows an embodiment of components for the look up table 622 of FIG. 6.

FIG. 7 shows an embodiment of components for the look up table 622 of FIG. 6. The look up table receives inputs A and B. The input A is provided to pass gates 701 and 703 directly, and to pass gates 702 and 704 through inverter 710. The signal A thus controls pass gates 701 and 702 to provide one of the outputs from memory cells 713 and 714 to pass gate 721. The signal A further controls pass gates 703 and 704 to provide one of the outputs from memory cells 711 and 712 to pass gate 720. The signal B is provided to pass gate 721 directly, and to pass gate 720 through inverter 730. The signal B causes only one memory cell output to be provided as a DATAOUT output signal. By appropriately programming the memory cells 711–714, the look up table of FIG. 7 can be set to function as an AND gate, an OR gate, or other structure driven by inputs A and B to provide the output DATAOUT.

Figure 8:
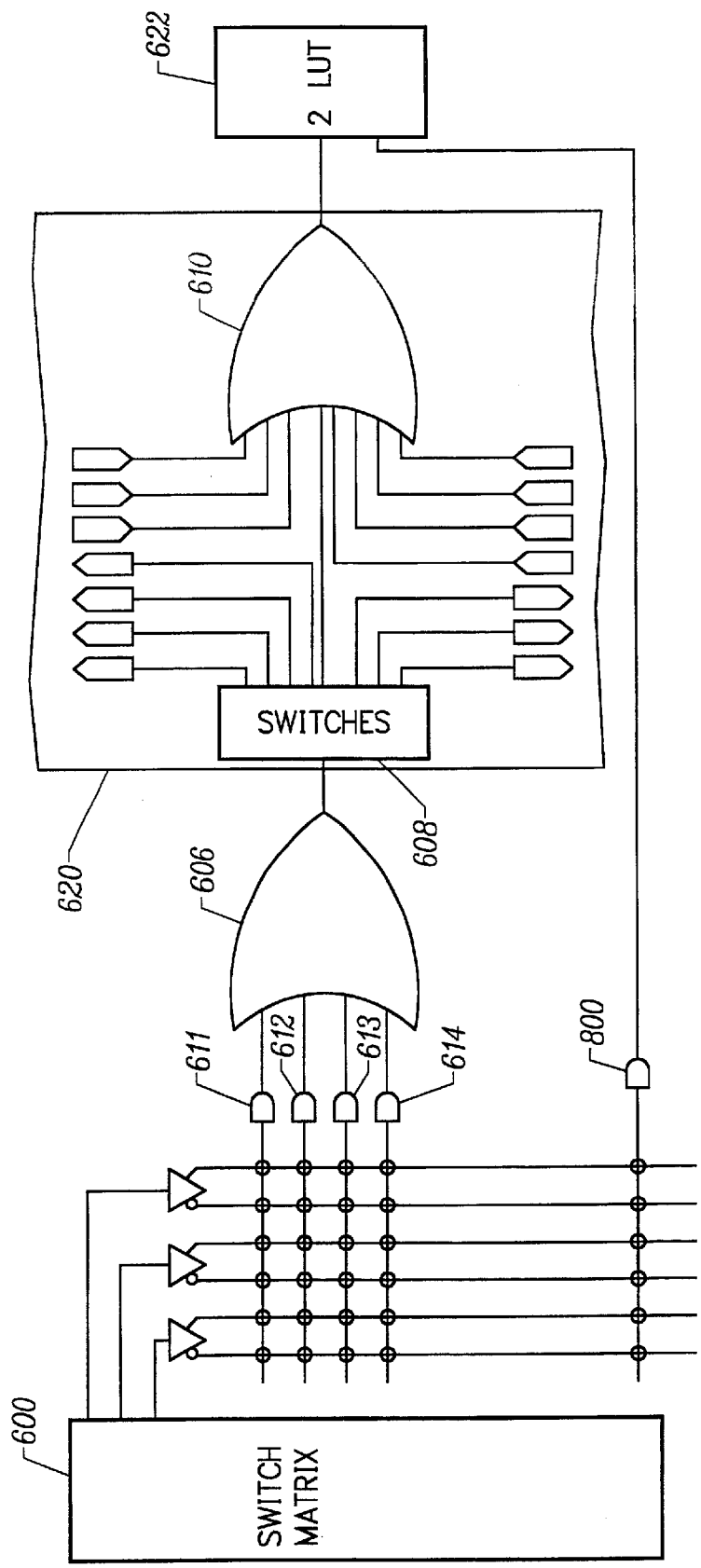
FIG. 8 shows modifications to the circuitry of FIG. 6 to create another embodiment in accordance with the present invention for use with a CPLD.

FIG. 8 shows modifications to the circuitry of FIG. 6 to create another embodiment in accordance with the present invention. Circuitry carried over from FIG. 6 to FIG. 8 is similarly labeled. As shown in FIG. 8, a product term 800 is provided directly to the 2 input look up table 622. The connections from the product term 604 of FIG. 6 through inverter 605 and to the inputs of product terms 611–614 are removed in FIG. 8. Because the 2 input LUT 622 can be programmed to provide any number of functions, it can be programmed to provide the function of inverter 605 from FIG. 6. The look up table 622 can similarly be programmed to AND the product term 800 with the product terms 611–614, as performed by a direct connection from inverter 605 in FIG. 6 to the inputs to AND gates 611–614 in FIG. 6.

Figure 9:
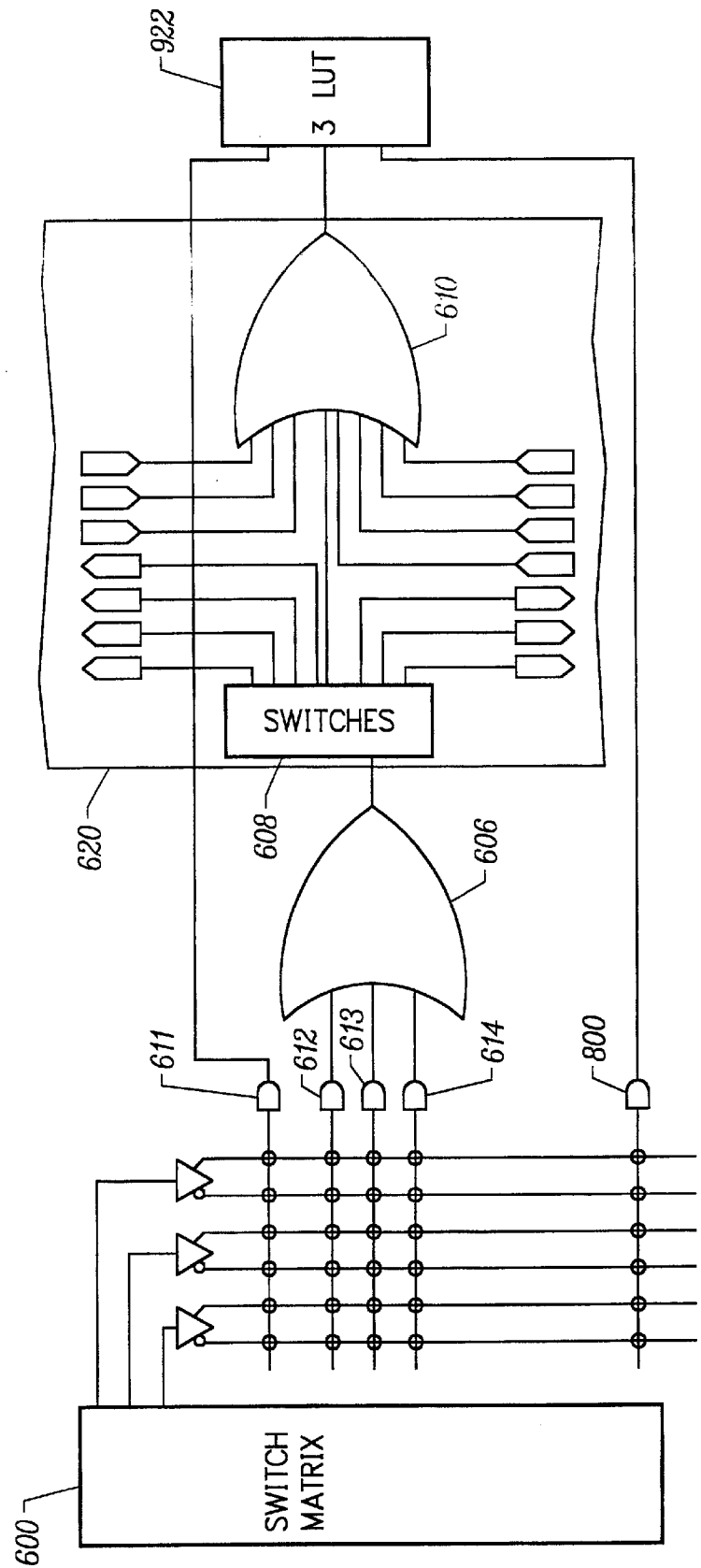
FIG. 9 shows modifications to the circuitry of FIG. 8 to create another embodiment in accordance with the present invention for use with a CPLD.

FIG. 9 shows modifications to the circuitry of FIG. 8 to provide an additional embodiment in accordance with the present invention. Components carried over from previous figures are similarly labeled in FIG. 9. FIG. 9 replaces the 2 input LUT 622 from FIG. 8 with a 3 input LUT 922. Two of the inputs to the 3 input LUT are provided from product term 800 and the output of OR gate 610 as in the circuit of FIG. 8. An additional input to the LUT 922 is provided by disconnecting the product term 611 from the OR gate 606 and providing it directly to the LUT 922. As configured, the LUT 922 can be programmed so that the circuit of FIG. 9 functions as if the product term 611 were provided to the OR gate 606 as in FIG. 8. The LUT 922, however, can also be programmed so that the product term 611 can be used as an input for other Boolean functions. For example the LUT 922 could be configured as an adder/subtractor, with one of the three inputs selecting whether the operation is an add or subtract, and the remaining two inputs providing the terms for the addition operation.

Figure 10:
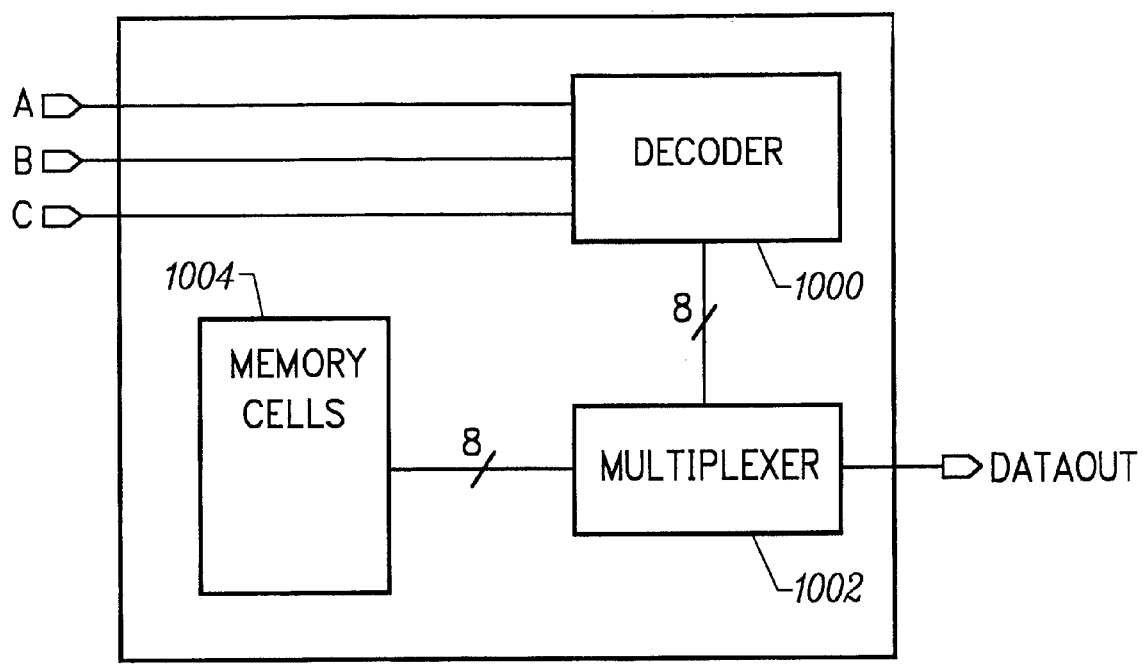
FIG. 10 shows an embodiment of circuitry which can be used for the three input LUT of FIG. 9.

FIG. 10 shows an embodiment of circuitry which can be used for the three input LUT of FIG. 9. The look up table of FIG. 10 includes a decoder 1000 receiving the three input signals labeled A, B and C. The decoder 1000 provides eight output signals to the gates of 8 separate pass gates having source to drain paths connecting 8 cells of memory cells 1004 to the DATAOUT output terminal. The pass gates driven by the decoder 1000 form the multiplexer 1002. The output of the decoder 1000 will function to activate one of the pass gates of multiplexer 1002 in response to an input signal A-C to apply the data stored in a corresponding cell of memory cells 1004 to the output DATAOUT of the look up table. By appropriately programming the memory cells 1004, the look up table can be set to function as an AND gate, an OR gate, or other structure as desired.

The structure of FIG. 10 can be modified to form the two input LUT 622 for FIGS. 6 and 8. To provide the modifications, the decoder 1000 is made a 2 input device driving 4 pass gates in multiplexer 1002. The multiplexer 1002 will then provide the output of one of four memory cells 1004 to the DATAOUT port. The circuitry of FIG. 7 avoids the additional circuitry required for both the decoder and multiplexer of FIG. 10.

Figure 11:
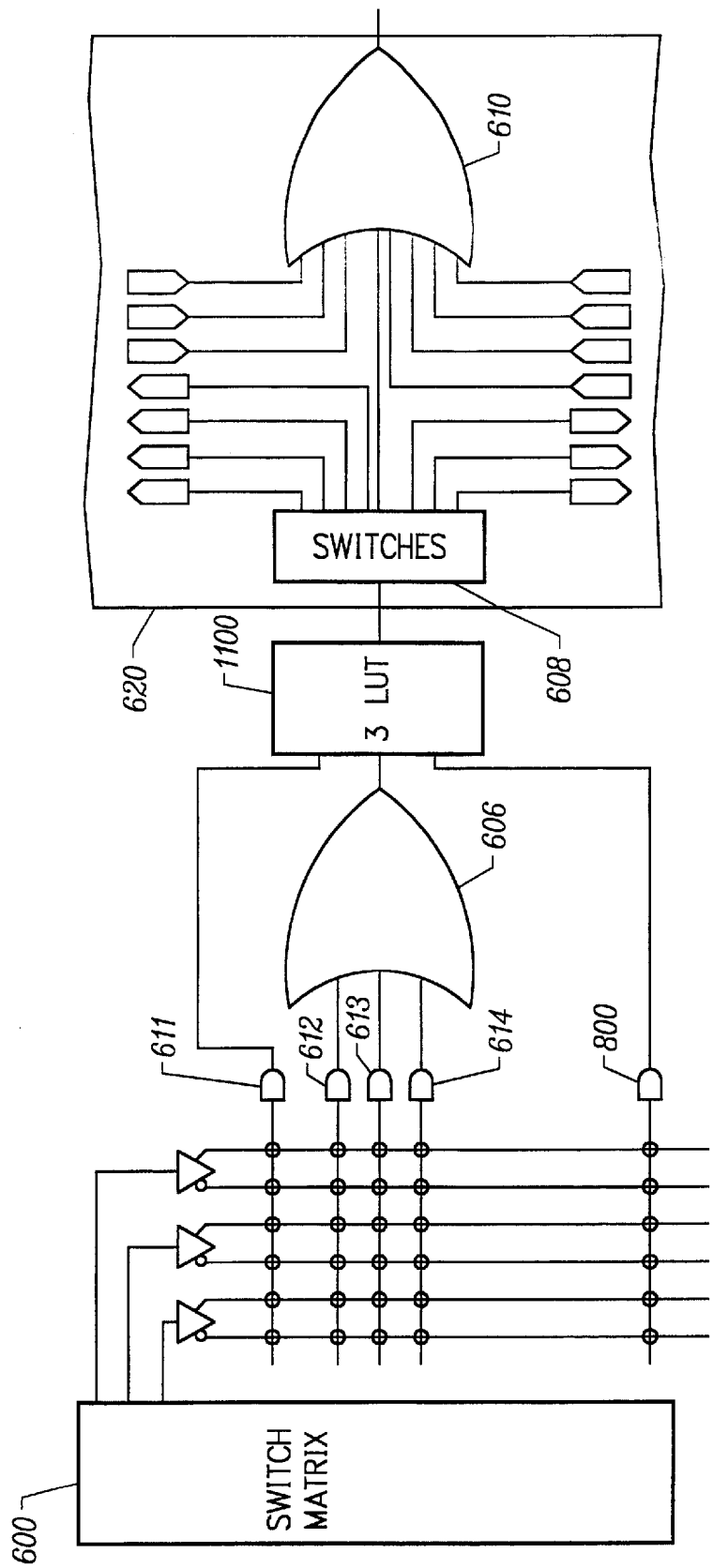
FIG. 11 shows modifications to the circuitry of FIG. 9 to create another embodiment in accordance with the present invention for use with a CPLD.

FIG. 11 shows modifications to the circuitry of FIG. 9 to create another embodiment in accordance with the present invention for use with a CPLD. In FIG. 11, the a three input LUT 1100 is added before the clustering circuit 620. The LUT 1100 receives the product term outputs 611 and 800, as well as the output of OR gate 606. The output of the LUT 110 is provided to the switches 608 of the cluster 620. The output of the cluster 620 can be provided to another LUT, such as the LUT 922 shown in FIG. 9, with other inputs of the LUT being driven by other OR gate outputs from the cluster, or from product term lines. The output of an OR gate 610 of the cluster 620 can further be provided to a gate, such as an XOR gate. Placing the LUT 1100 before the cluster 620 enables the output of the LUT 1100 to be routed to OR gates other than gate 610 in the cluster 620, enabling gate 610 to be used for other purposes. Placing the LUT 1100 before the cluster 620 also allows the output of the LUT 1100 to be combined with other signals in the cluster 620.

Although the present invention has been described above with particularity, this was merely to teach one of ordinary skill in the art how to make and use the invention. Many other modifications will fall within the scope of the invention, as that scope is defined by the claims provided below.

What is claimed is:

1. A programmable logic device (PLD) comprising:

an OR gate having first inputs, a second input and an output;

first product term lines having outputs coupled to the first inputs of the OR gate;

a second product term line having an output;

an inverter coupling the output of the second product term line to the second input of the OR gate; and a look up table having a first input coupled to the output of the OR gate, a second input coupled to the output of the inverter, and having an output.

2. The PLD of claim 1, wherein the look up table has a third input, and the PLD further comprises:

a third product term line having an output coupled to the third input of the look up table.

3. The PLD of claim 2, wherein the look up table comprises:

a decoder having inputs providing the first, second and third inputs of the lookup table, and having outputs;

memory cells; and a multiplexer having select inputs connected to the outputs of the decoder, data inputs connected to the memory cells, and having a data output providing the output of the look up table.

4. The PLD of claim 1, wherein the look up table comprises:

memory cells;

a first transistor having a source to drain path coupling a first one of the memory cells to a first node, and having a gate forming the first input of the look up table;

a second transistor having a source to drain path coupling a second one of the memory cells to a second node, and having a gate forming the first input of the look up table;

a first inverter;

a third transistor having a source to drain path coupling a third one of the memory cells to the first node, and having a gate coupled to the first input of the look up table through the first inverter;

a fourth transistor having a source to drain path coupling a fourth one of the memory cells to the second node, and having a gate coupled to the first input of the look up table through the first inverter;

a fifth transistor having a source to drain path coupling the first node to the output of the look up table, and having a gate coupled to the second input of the look up table;

a second inverter; and a sixth transistor having a source to drain path coupling the second node to the output of the look up table, and having a gate coupled to the second input of the look up table through the second inverter.

5. The PLD of claim 1 further comprising a routing cluster coupling the output of the OR gate to the first input of the look up table, the routing cluster comprising:

switches having inputs and outputs, wherein one of the inputs of the switches is coupled to the output of the OR gate; and cluster OR gates having inputs coupled to outputs of the switches, and outputs, wherein one of the outputs of the cluster OR gates is coupled to the first input of the look up table.

6. The PLD of claim 1 further comprising a routing cluster coupled to the output of the look up table, the routing cluster comprising:

switches having inputs and outputs, wherein one of the inputs of the switches is coupled to the output of the look up table; and cluster OR gates having inputs coupled to outputs of the switches.

7. A programmable logic device (PLD) comprising:

an OR gate having first inputs, a second input, and an output;

an exclusive (XOR) gate having a first input coupled to the output of the OR gate, and having a second input;

first product term lines having outputs coupled to the first inputs of the OR gate;

a second product term line having an output;

a buffer having an input coupled to the output of the second product term line, and having an output, the buffer translating a digital voltage received at the buffer input from a first voltage range to a second voltage range greater than the first voltage range to provide a signal at the buffer output;

a first multiplexer having a first input coupled to receive a first voltage, a second input coupled to the output of the buffer, and an output coupled to the second input of the OR gate; and a second multiplexer having a first input coupled to receive a second voltage, a second input coupled to the output of the buffer, and an output coupled to the second input of the XOR gate.

8. The PLD of claim 7 further comprising:

an inverter coupling the output of the buffer to the second input of the first multiplexer and to the second input of the second multiplexer.

9. A programmable logic device (PLD) comprising:

an OR gate having first inputs, a second input and an output;

first product term lines having outputs coupled to the first inputs of the OR gate;

a second product term line having an output; and a look up table having a first input coupled to the output of the OR gate, a second input coupled to the output of the second product term line, and having an output.

10. The PLD of claim 9, wherein the look up table has a third input, and the PLD further comprises:

a third product term line having an output coupled to the third input of the look up table.

11. A programmable logic device (PLD) comprising:

an OR gate having first inputs, a second input and an output;

first product term lines having outputs coupled to the first inputs of the OR gate;

a second product term line having an output; and a look up table having a first input coupled to the output of the OR gate, a second input coupled to the output of the second product term line without an intervening OR gate, and having an output.

12. The PLD of claim 10, wherein the second product term is coupled to the first input of the look up table without an intervening OR gate, and wherein the third product term is coupled to the first input of the look up table without an intervening OR gate.

13. The PLD of claim 10, wherein the look up table comprises:

a decoder having inputs providing the first, second and third inputs of the lookup table, and having outputs;

memory cells; and a multiplexer having select inputs connected to the outputs of the decoder, data inputs connected to the memory cells, and having a data output providing the output of the look up table.

14. A programmable logic device (PLD) comprising:

an OR gate having first inputs, a second input and an output;

first product term lines having outputs coupled to the first inputs of the OR gate;

a second product term line having an output; and a look up table having a first input coupled to the output of the OR gate, a second input coupled to the output of the second product term line, and having an output, wherein the look up table comprises:

memory cells;

a first transistor having a source to drain path coupling a first one of the memory cells to a first node, and having a gate forming the first input of the look up table;

a second transistor having a source to drain path coupling a second one of the memory cells to a second node, and having a gate forming the first input of the look up table;

a first inverter;

a third transistor having a source to drain path coupling a third one of the memory cells to the first node, and having a gate coupled to the first input of the look up table through the first inverter;

a fourth transistor having a source to drain path coupling a fourth one of the memory cells to the second node, and having a gate coupled to the first input of the look up table through the first inverter;

a fifth transistor having a source to drain path coupling the first node to the output of the look up table, and having a gate coupled to the second input of the look up table;

a second inverter; and a sixth transistor having a source to drain path coupling the second node to the output of the look up table, and having a gate coupled to the second input of the look up table through the second inverter.

15. A programmable logic device (PLD) comprising:

an OR gate having first inputs, a second input and an output;

first product term lines having outputs coupled to the first inputs of the OR gate;

a second product term line having an output;

a look up table having a first input coupled to the output of the OR gate, a second input coupled to the output of the second product term line, and having an output; and a routing cluster coupling the output of the OR gate to the first input of the look up table, the routing cluster comprising:

switches having inputs and outputs, wherein one of the inputs of the switches is coupled to the output of the OR gate; and cluster OR gates having inputs coupled to outputs of the switches, and outputs, wherein one of the outputs of the cluster OR gates is coupled to the first input of the look up table.

16. A programmable logic device (PLD) comprising:

an OR gate having first inputs, a second input and an output;

first product term lines having outputs coupled to the first inputs of the OR gate;

a second product term line having an output;

a look up table having a first input coupled to the output of the OR gate, a second input coupled to the output of the second product term line, and having an output; and a routing cluster coupled to the output of the look up table, the routing cluster comprising:

switches having inputs and outputs, wherein one of the inputs of the switches is coupled to the output of the look up table; and cluster OR gates having inputs coupled to outputs of the switches.

\* \* \* \* \*